United States Patent
Gros-Jean et al.

(10) Patent No.: US 7,501,291 B2
(45) Date of Patent: Mar. 10, 2009

(54) PROCESS FOR FABRICATING AN INTEGRATED CIRCUIT INCLUDING A CAPACITOR WITH A COPPER ELECTRODE

(75) Inventors: Michael Gros-Jean, Grenoble (FR); Nicolas Casanova, Crolles (FR); Jean Michailos, Meylan (FR)

(73) Assignee: STMicroelectronics SA, Montrouge (FR)

( * ) Notice: Subject to any disclaimer, the term of this patent is extended or adjusted under 35 U.S.C. 154(b) by 252 days.

(21) Appl. No.: 11/379,246

(22) Filed: Apr. 19, 2006

(65) Prior Publication Data
US 2006/0240576 A1    Oct. 26, 2006

(30) Foreign Application Priority Data
Apr. 19, 2005    (FR) .................... 05 03892

(51) Int. Cl.
*H01L 21/00* (2006.01)
*H01L 21/8242* (2006.01)

(52) U.S. Cl. .............. 438/3; 438/239; 438/253
(58) Field of Classification Search ................ 438/3, 438/239–256
See application file for complete search history.

(56) References Cited

U.S. PATENT DOCUMENTS

| | | | |
|---|---|---|---|
| 6,387,775 B1 | 5/2002 | Jang et al. | 438/396 |
| 6,444,568 B1 | 9/2002 | Sundararajan et al. | 438/627 |
| 6,709,918 B1 | 3/2004 | Ng et al. | 438/253 |
| 6,791,160 B2 * | 9/2004 | Ejiri et al. | 257/532 |
| 6,876,028 B1 | 4/2005 | Coolbaugh et al. | 257/306 |
| 7,141,864 B2 * | 11/2006 | Kaneko | 257/532 |
| 2002/0027286 A1 | 3/2002 | Sundararajan et al. | 257/751 |
| 2002/0119250 A1 | 8/2002 | Campana et al. | 427/255 |
| 2002/0179955 A1 | 12/2002 | Morimoto et al. | 257/306 |
| 2004/0084680 A1 | 5/2004 | Ruelke et al. | 257/77 |
| 2004/0152256 A1 | 8/2004 | Noguchi et al. | 438/250 |

* cited by examiner

*Primary Examiner*—Cuong Q Nguyen
(74) *Attorney, Agent, or Firm*—Lisa K. Jorgenson; Allen, Dyer, Doppelt, Milbrath & Gilchrist, P.A.

(57) ABSTRACT

The process and integrated circuit include at least one capacitor in which at least one of the electrodes is made of copper. The method includes forming a nitrogen-doped silicon carbide film between the copper electrode and the dielectric film of the capacitor.

10 Claims, 7 Drawing Sheets

PROCESS FOR FABRICATING AN INTEGRATED CIRCUIT INCLUDING A CAPACITOR WITH A COPPER ELECTRODE

FIELD OF THE INVENTION

The present invention relates to integrated circuits, and more particularly, to integrated circuits including at least one capacitor having at least one copper electrode.

BACKGROUND OF THE INVENTION

It is known to produce planar or three-dimensional capacitors using an aluminum technology (RIE or reactive ion etching) or a copper technology (damascene method). The capacitor is conventionally obtained from an MIM (metal-insulator-metal) capacitive multilayer in which the lower layer is a conductive material, such as for example TiN, the insulator is a dielectric material having a high permittivity (or high-k material) and the upper electrode is a conductive material, such as for example TiN. Generally, these capacitors are produced individually and then assembled in a complex circuit. The production of capacitors within an integrated circuit still remains a challenge today since this production must be compatible with the existence of active components within this complex circuit.

It is known in the scientific literature that copper can fulfill the role of electrode for a high-permittivity dielectric. The use of a copper electrode has many advantages. This is because the electronic operation of copper is high. The barrier height between the electrode and the dielectric is thus favorable for limiting leakage currents. However, the use of copper as electrode has a number of disadvantages. For example, since the process steps are often carried out in an oxygen atmosphere, the copper interface has a tendency to oxidize very easily, making the material of poor quality. In addition, copper has a tendency to diffuse into the dielectric, substantially degrading the electrical performance. Finally, when the dielectric is an oxide, such as for example tantalum oxide ($Ta_2O_5$), copper has a tendency to be oxidized by oxygen from the oxide diffusing into the copper layer.

SUMMARY OF THE INVENTION

The invention provides an approach to the above discussed problems, including inserting at least one nitrogen-doped silicon carbide film into the capacitor.

One aspect of the invention is directed to a process for fabricating an integrated circuit comprising at least one capacitor in which at least one of the electrodes is made of copper. The method includes a step of forming a nitrogen-doped silicon carbide film, for example by plasma-enhanced chemical vapor deposition or by atomic layer deposition, or optionally plasma-enhanced atomic layer deposition, between the copper electrode and the dielectric having a high dielectric constant to isolate and protect the copper electrode from the oxidizing atmosphere during the process for fabricating the integrated circuit and from the diffusion of oxygen from the dielectric.

According to one method of implementation, the process includes a step of depositing a first nitrogen-doped silicon carbide film, for example by plasma-enhanced chemical vapor deposition or by atomic layer deposition, or optionally plasma-enhanced atomic layer deposition, on the lower copper electrode and a step of depositing a second nitrogen-doped silicon carbide film, for example by the above mentioned chemical deposition processes, on the dielectric film before the copper film forming the upper electrode is deposited. Preferably, the thickness of each nitrogen-doped silicon carbide film is at least 3 angstroms.

Another aspect of the invention is directed to an integrated circuit comprising a capacitor, including at least one copper electrode and at least one nitrogen-doped silicon carbide film lying between the copper electrode and the dielectric film having a high dielectric constant. According to one embodiment, the capacitor comprises two copper electrodes, a nitrogen-doped silicon carbide film between the lower copper electrode and the dielectric, and a nitrogen-doped silicon carbide film between the upper copper electrode and the dielectric. Preferably, the thickness of the nitrogen-doped silicon carbide film or films is at least 3 angstroms.

BRIEF DESCRIPTION OF THE DRAWINGS

Other objects, features, aspects and advantages of the invention will become more apparent from reading the detailed description of non-limiting embodiments and methods of implementation, and from the appended drawings in which.

DETAILED DESCRIPTION OF THE PREFERRED EMBODIMENTS

Figure 1:
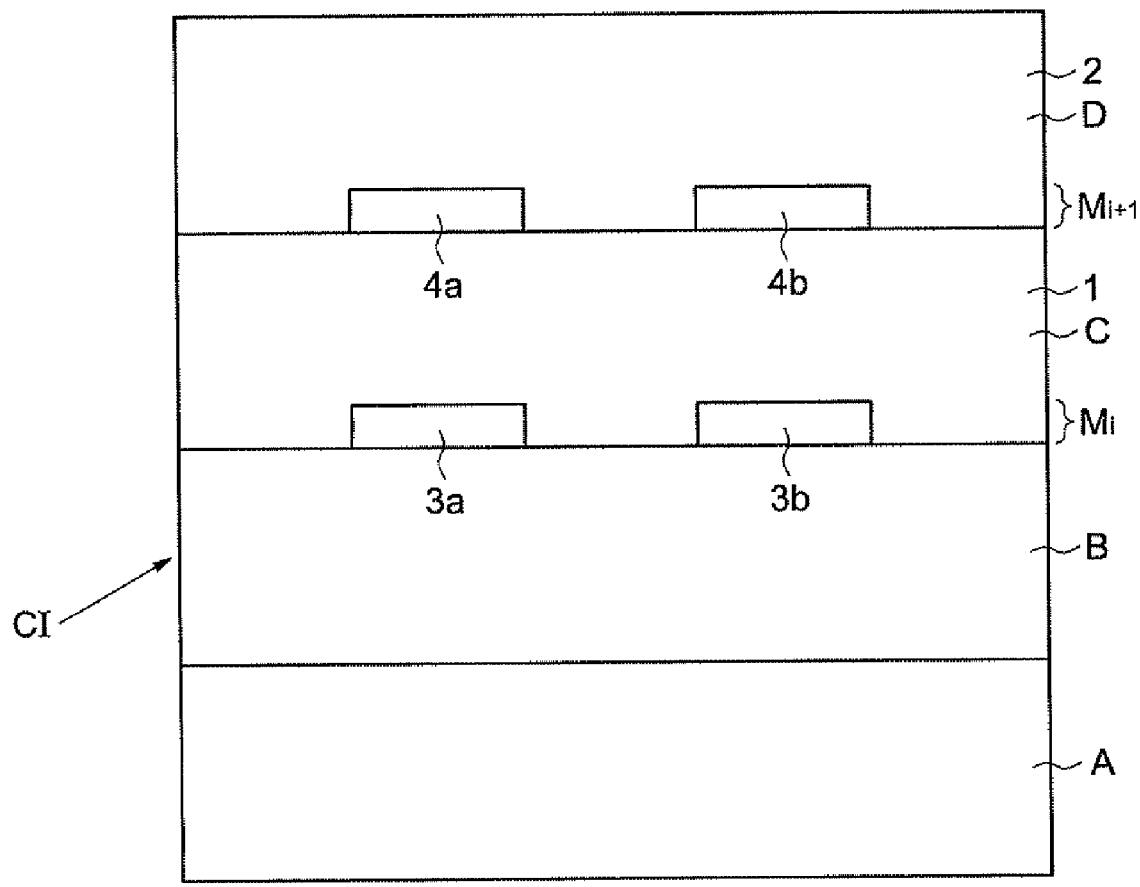
FIGS. 1 to 5 are schematic cross-sectional views illustrating the main steps of one method of implementing a process for fabricating a three-dimensional capacitor according to the invention.

FIG. 1 shows an integrated circuit IC comprising a silicon substrate A on which a metal-polysilicon inter dielectric film B has been deposited, and on which several interconnection levels C and D rest. The metallization level $M_i$ of the interconnection level C comprises metal tracks 3a and 3b on which an intermetallic dielectric 1 has been deposited. The interconnection level D includes the metal level $M_{i+1}$ (copper metal tracks 4a and 4b) on which an intermetallic dielectric 2 has been deposited. The interconnection levels C and D may incorporate passive components.

Figure 2:
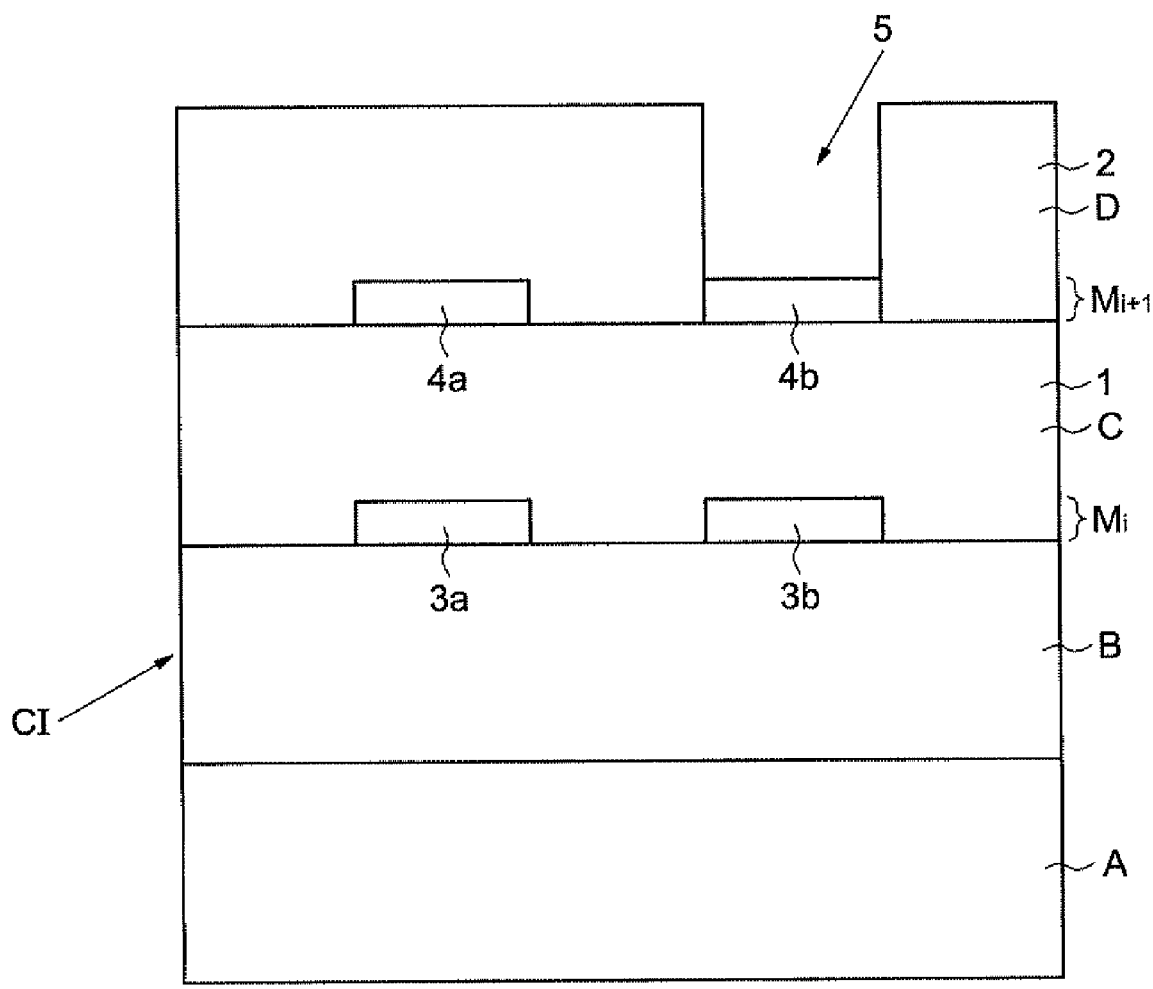
Figure 3:
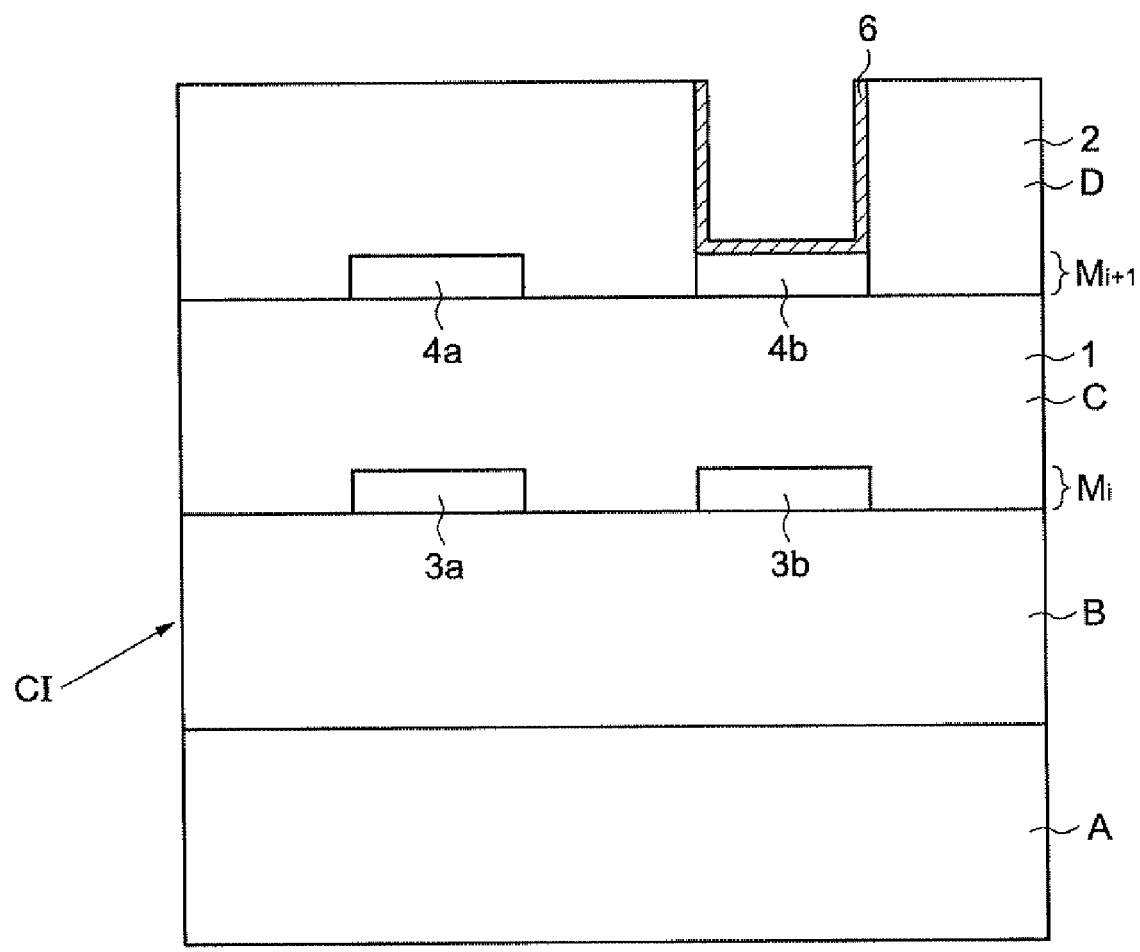

FIG. 2 illustrates the production of a trench within the integrated circuit IC. A trench 5 has been produced in a conventional manner known per se within the intermetallic dielectric 2 of the level D by photolithography followed by etching, so as to expose the metal track 4b. FIG. 3 illustrates the deposition of a nitrogen-doped silicon carbide film 6, for example by PECVD (plasma-enhanced chemical vapor deposition) or by ALD (atomic layer deposition) or by PEALD (plasma-enhanced atomic layer deposition). The thickness of the nitrogen-doped silicon carbide film is at least 3 angstroms.

Figure 4:
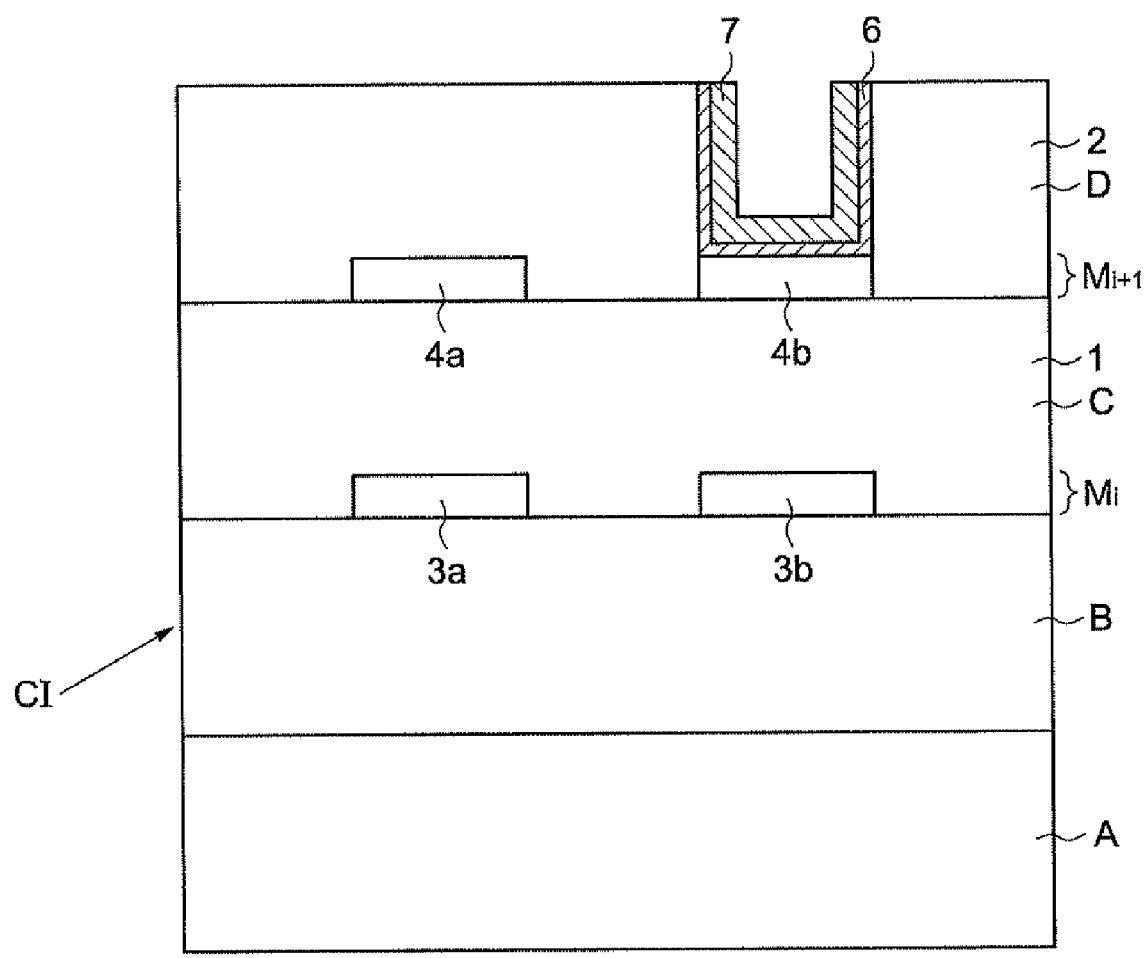

FIG. 4 illustrates the deposition of a film 7 of dielectric having a high dielectric constant on the previously deposited nitrogen-doped silicon carbide film 6. Dielectrics having a high dielectric constant are those whose dielectric constant is greater than 6, such as for example tantalum oxide ($Ta_2O_5$) or hafnium oxide ($HfO_2$). This film may be deposited by a process such as that described in Patent Application FR 2 847 593. Thus, for example, the copper is heated to a heating temperature of between 200° C. and 400° C. and a gas mixture containing tert-butylimino-tris-diethylaminotantalum or t-BuN=Ta(NEt$_2$)$_3$ is made to flow in contact with the heated carrier material in an oxidizing atmosphere, the tert-butyl-imino-tris-diethylaminotantalum partial pressure being equal to 25 mtorr or higher.

Thus, the combination of: the TBTDET organometallic precursor; a low temperature, preferably between 300° C. and 350° C.; and a high TBTDET partial pressure, makes it possible to obtain, at low temperature, tantalum pentoxide of good quality with respect to leakage currents. Thus, for example, when a voltage in absolute value of about 3.6 volts is applied across the terminals of the dielectric, the measured leakage current in amps per cm$^2$ of dielectric area is less than $10^{-((x+20)/10)}$, x being the measured tantalum pentoxide thickness in nanometers, and this being applicable for thicknesses ranging from 25 to 65 nanometers. By controlling the partial pressure of the TBTDET precursor, it is possible to control the rate of deposition and the quality of the nucleation.

Figure 5:
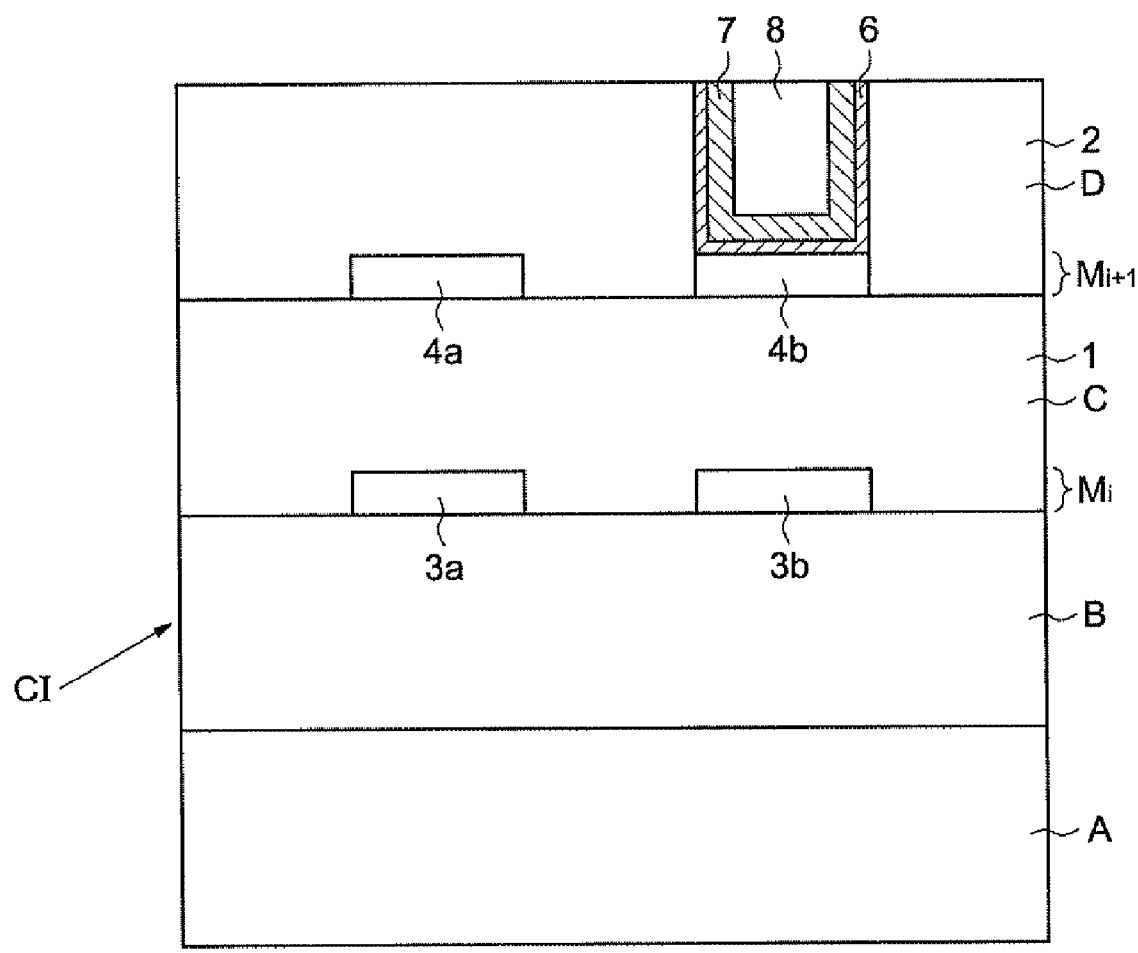

FIG. 5 shows the capacitor once the upper electrode 8 has been deposited on the dielectric film 7. The upper electrode may for example be made of tungsten (W), titanium nitride (TiN) or tantalum nitride (TaN).

Figure 6:
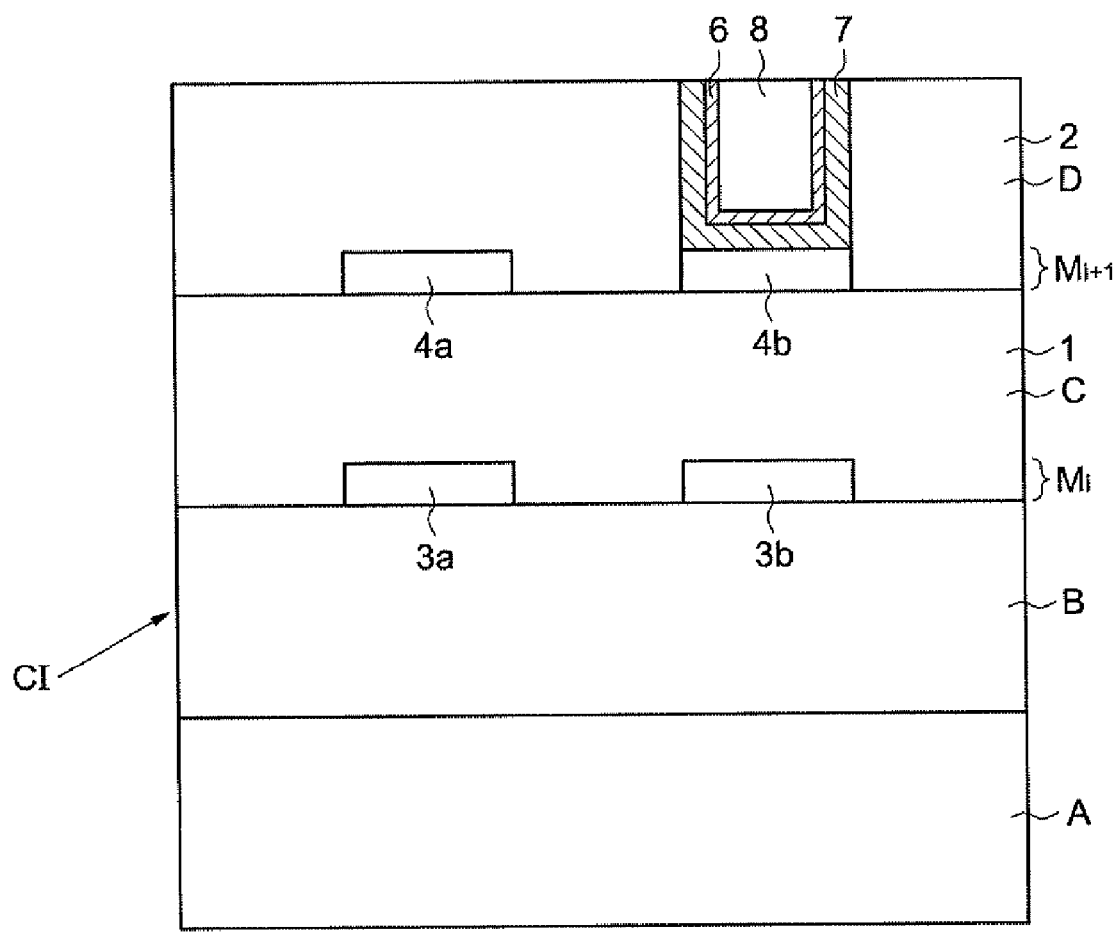
FIG. 6 is a schematic cross-sectional view illustrating an embodiment of a capacitor according to the invention.

FIG. 6 illustrates another embodiment of the invention. In this particular embodiment, the lower electrode 4b is made of a conventional conductive material and the upper electrode 8 is made of copper. Thus, the nitrogen-doped silicon carbide film 6 lies between the dielectric film 7 and the upper copper electrode 8.

Figure 7:
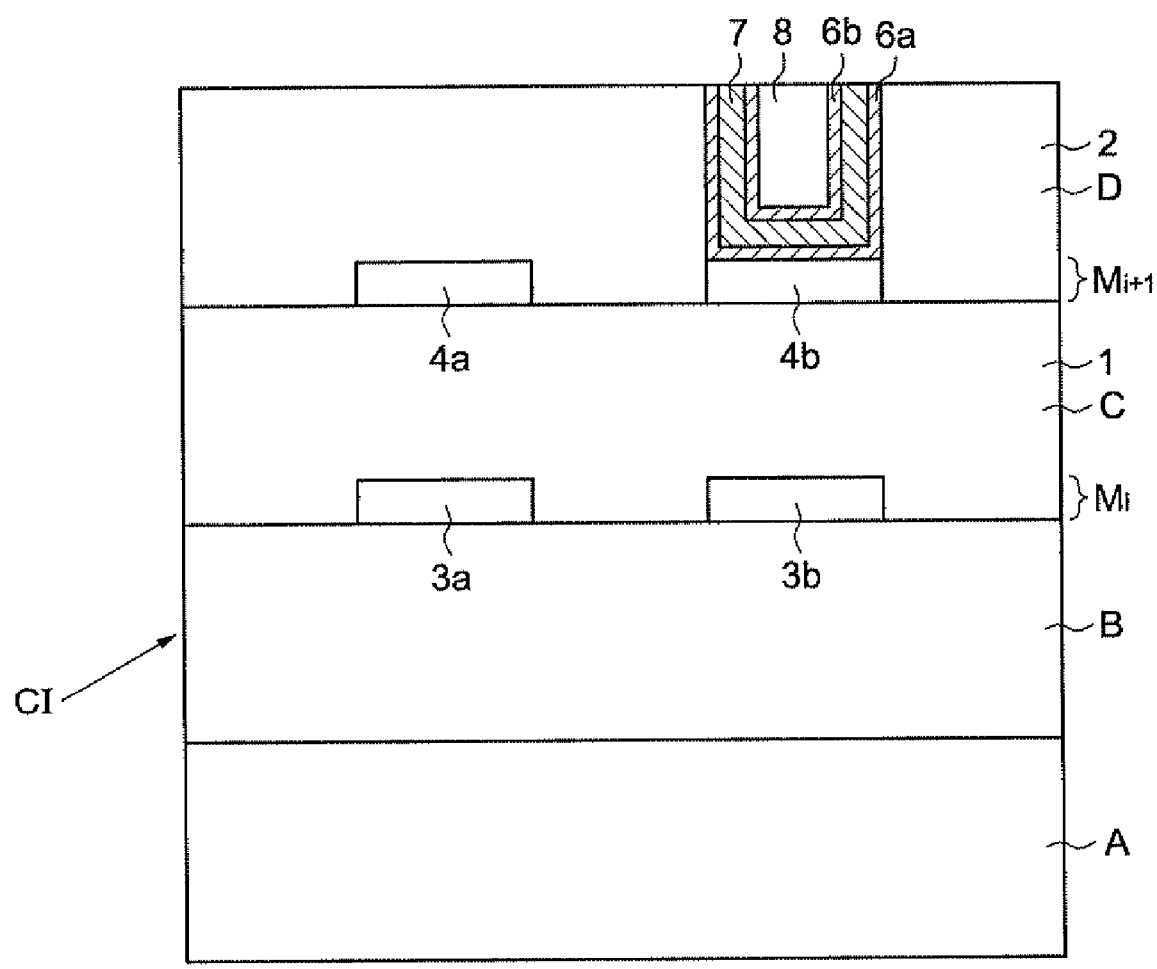
FIG. 7 is a schematic cross-sectional view illustrating another embodiment of a capacitor according to the invention.

FIG. 7 shows another embodiment, comprising a capacitor produced from two copper electrodes 4b and 8. Thus, the capacitor comprises two nitrogen-doped silicon carbide films 5a and 6b, one lying between the lower copper electrode 4b and the dielectric film 7 and the other lying between the dielectric film 7 and the upper copper electrode 8.

The presence of the nitrogen-doped silicon carbide film provides both a chemical barrier, preventing the migration of oxygen atoms from the dielectric into the copper electrode, and an electrical barrier, given that nitrogen-doped silicon carbide is a dielectric (k~5). The nitrogen-doped silicon carbide thus provides a more effective electrical barrier than most high-permittivity dielectrics.

That which is claimed is:

1. A method for fabricating an integrated circuit including at least one capacitor having at least one copper electrode, the method comprising:
    forming a high-k dielectric adjacent the at least one copper electrode; and
    forming a nitrogen-doped silicon carbide film between the at least one copper electrode and the high-k dielectric.

2. The method according to claim 1, wherein the at least one copper electrode comprises a lower copper electrode and an upper copper electrode; and wherein the nitrogen-doped silicon carbide film comprises a first nitrogen-doped silicon carbide film is formed between the high-k dielectric and the lower copper electrode, and a second nitrogen-doped silicon carbide film formed between the high-k dielectric and the upper copper electrode.

3. The method according to claim 1, wherein the nitrogen-doped silicon carbide film has a thickness of at least three angstroms.

4. The method according to claim 1, wherein forming the nitrogen-doped silicon carbide film comprises plasma-enhanced chemical vapor deposition of the nitrogen-doped silicon carbide film.

5. The method according to claim 1, wherein forming the nitrogen-doped silicon carbide film comprises plasma-enhanced atomic layer deposition of the nitrogen-doped silicon carbide film.

6. A method for fabricating an integrated circuit capacitor, the method comprising:
    forming at least one copper electrode;
    forming a dielectric adjacent the at least one copper electrode; and
    forming a nitrogen-doped silicon carbide film between the at least one copper electrode and the dielectric.

7. The method according to claim 6, wherein forming the at least one copper electrode comprises forming a lower copper electrode and an upper copper electrode; and wherein forming the nitrogen-doped silicon carbide film comprises forming a first nitrogen-doped silicon carbide film is between the dielectric and the lower copper electrode, and forming a second nitrogen-doped silicon carbide film between the dielectric and the upper copper electrode.

8. The method according to claim 6, wherein the nitrogen-doped silicon carbide film has a thickness of at least three angstroms.

9. The method according to claim 6, wherein forming the nitrogen-doped silicon carbide film comprises plasma-enhanced chemical vapor deposition of the nitrogen-doped silicon carbide film.

10. The method according to claim 6, wherein forming the nitrogen-doped silicon carbide film comprises plasma-enhanced atomic layer deposition of the nitrogen-doped silicon carbide film.

* * * * *